(12) United States Patent
Jung et al.

(10) Patent No.: US 7,056,647 B2
(45) Date of Patent: Jun. 6, 2006

(54) FLASH MEMORY WITH REDUCED SOURCE RESISTANCE AND FABRICATION METHOD THEREOF

(75) Inventors: Sung Mun Jung, Gyeonggi-do (KR); Chang Hun Han, Gyeonggi-do (KR)

(73) Assignee: DongbuAnam Semiconductor Inc., Seoul (KR)

(*) Notice: Subject to any disclaimer, the term of this patent is extended or adjusted under 35 U.S.C. 154(b) by 135 days.

(21) Appl. No.: 10/749,648

(22) Filed: Dec. 30, 2003

(65) Prior Publication Data
US 2004/0161706 A1    Aug. 19, 2004

(30) Foreign Application Priority Data
Dec. 30, 2002  (KR) ............... 10-2002-0087357

(51) Int. Cl.
*G03C 5/00*    (2006.01)
(52) U.S. Cl. ...................... 430/313; 430/311
(58) Field of Classification Search .................. None
See application file for complete search history.

(56) References Cited

U.S. PATENT DOCUMENTS

| 5,696,019 | A | 12/1997 | Chang |
| 6,153,494 | A | 11/2000 | Hsieh et al. |
| 6,436,765 | B1 | 8/2002 | Liou et al. |
| 6,596,608 | B1 * | 7/2003 | Saito ..................... 438/424 |

FOREIGN PATENT DOCUMENTS

JP    2002-115175    4/2002

* cited by examiner

*Primary Examiner*—John A. McPherson
*Assistant Examiner*—Deborah Chacko-Davis
(74) *Attorney, Agent, or Firm*—Saliwanchik, Lloyd & Saliwanchik

(57) ABSTRACT

A flash memory device having a reduced source resistance and a fabrication method thereof are disclosed. An example flash memory includes a cell region including a gate, a source line, a drain contact, and a cell trench area for device isolation on a silicon substrate. The example flash memory also includes a peripheral region positioned around the cell region and including a subsidiary circuit and a peripheral trench area for device isolation on the silicon substrate, wherein the cell trench area of the cell region is shallower than the peripheral trench area of the peripheral region.

4 Claims, 5 Drawing Sheets

FLASH MEMORY WITH REDUCED SOURCE RESISTANCE AND FABRICATION METHOD THEREOF

FIELD OF THE DISCLOSURE

The present disclosure relates generally to semiconductor devices and, more particularly, to a flash memory having a reduced source resistance.

BACKGROUND

Generally, a NOR-type flash memory adopts a common source method. In other words, there a contact is typically formed in every 16 cells and the source lines of the 16 cells are connected to form an N+ type diffusion layer. For a design rule of 0.25 μm class or smaller than 0.18 μm class, most semiconductor devices are adopting shallow trench isolation (STI) as a device isolation method. Flash memory devices, smaller than 0.35 μm class are adopting a self-aligned source (SAS) technique to reduce cell size.

These known techniques (e.g., STI and SAS) are described in detail below. FIG. 1a illustrates a top or plan view of a flash memory cell fabricated without employing the SAS technique. FIG. 1b illustrates the top view of a flash memory cell fabricated by employing the SAS technique. Referring to FIGS. 1a and 1b, a flash memory cell typically comprises a common source line 2, a gate 6, a device isolation area 8, i.e., a STI area, a drain contact 10, a bit line 9; and a gap 4 between the gate 6 and the common source line 2.

As shown in FIGS. 1a and 1b, the SAS technique can reduce cell size by forming the common source line 6 under the gap 4 and, therefore, is a valuable process in 0.25 μm technology. The SAS technique enables about a 20% reduction in the cell size of a flash memory.

FIG. 2 illustrates the top view of a flash memory cell array manufactured without employing the SAS technique. The flash memory cells have a drain contact 10 and are connected through a series of common source lines 2, that are vertical to the bit line 9.

FIG. 3a illustrates the top view of a flash memory cell array manufactured by employing the SAS technique. FIG. 3b is a cross-sectional view of FIG. 3a taken along the line a–a'. As shown in FIGS. 3a and 3b, in case of a flash memory adopting the SAS technique, a plurality of trench areas 8a are formed in parallel with the bit line 9 and ions are implanted into the trench areas 8a and active regions 1 to form the common source line 2. The common source line 2 has roughly a shape of square wave in a cross-sectional view. The trench areas 8a are filled with oxide by means of high density plasma to form the STI 8.

Here, as shown in FIG. 3b, the resistance per cell tends to increase abruptly because the common source line 2 is formed along the surface of the trench areas 8a and the active regions 1. The resistance of the common source line 2 increases because an actual surface area is enlarged due to junction resistance generated along the surface of the trench areas 8a, as shown in FIG. 3b, and because the resistivity of the sidewalls of the trench areas 8a also increases. In other words, during diffusion or ion implantation, relatively fewer ions are implanted into the sidewalls of the trench areas 8a and, therefore, resistance increases abruptly.

FIG. 4 illustrates a schematic diagram of a flash memory employing the common source line shown in FIG. 3a. As shown in FIG. 4, if the resistance per cell increases, each cell has a different value of back bias due to IR drop between the first cell and the eighth cell because a source contact is formed every 16 cells. Therefore, an error may occur when a flash memory performs a read operation. In particular, because the flash memory uses an internal high voltage, trench areas become deeper as cell size is reduced, thereby acting adversely on source resistance.

Table 1 shows IR drop of each cell when source resistance is 600Ω per cell. As shown in Table 1, voltages between the first and the eighth cells differ as much as 0.06 V, indicating that current difference occurs due to $V_{ds}$ (voltage difference between a source and a drain) difference between cells. Here, resistance means a source resistance of a cell.

TABLE 1

|  | First cell 1 | Second cell 2 | Third cell 3 | Fourth cell 4 | Fifth cell 5 | Sixth cell 6 | Seventh cell 7 | Eighth cell 8 | Ninth cell 9 |
|---|---|---|---|---|---|---|---|---|---|
| Left resistance | 600 | 1200 | 1800 | 2400 | 3000 | 3600 | 4200 | 4800 | 5400 |
| Right resistance | 9600 | 9000 | 8400 | 7800 | 7200 | 6600 | 6000 | 5400 | 4800 |
| Total resistance | 564.7 | 1058.8 | 1482.4 | 1835.3 | 2117.6 | 2329.4 | 2470.6 | 2541.2 | 2541.2 |
| IR drop | 0.017 | 0.032 | 0.044 | 0.055 | 0.064 | 0.070 | 0.074 | 0.076 | 0.076 |

FIG. 5 is a graph illustrating a value of source resistance according to the depth of a trench area. If a trench area is about 2400 Å in depth, resistance per cell is 600Ω. If a trench area is about 3600 Å in depth, resistance per cell is 880Ω, a 50% increase in comparison to 2400 Å. A 0.18 μm class flash memory has the 3500 Å depth of the trench area, which causes a pernicious effect on source resistance of a cell region. To solve this problem, a method of forming trench areas with different depth has been proposed. In a flash memory according to this conventional fabrication method, the depths of the trench areas are about 3500 Å in a peripheral region and about 1800 Å in a cell region. However, the conventional method may complicate the fabrication process and cause overlay because the cell region and the peripheral region have to be separately masked and etched.

BRIEF DESCRIPTION OF THE DRAWINGS

FIG. 4 illustrates a schematic diagram of a flash memory employing the common source line in FIG. 3a.

DETAILED DESCRIPTION

Figure 1A:
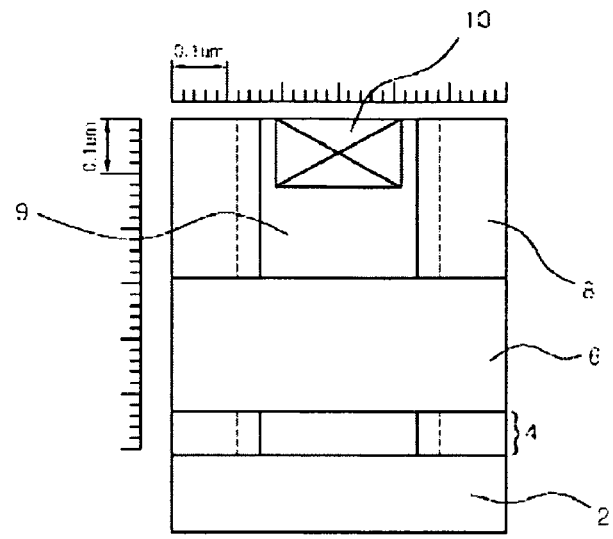
FIG. 1a illustrates, in a top view, a flash memory cell fabricated without employing an SAS process.
Figure 1B:
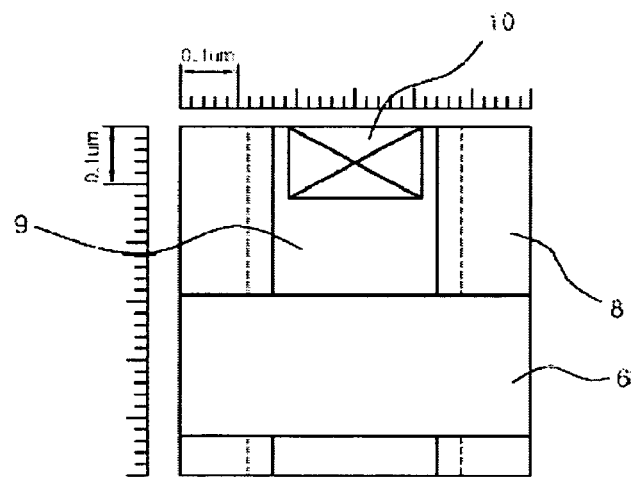
FIG. 1b illustrates, in a top view, a flash memory cell fabricated by employing the SAS process.
Figure 2:
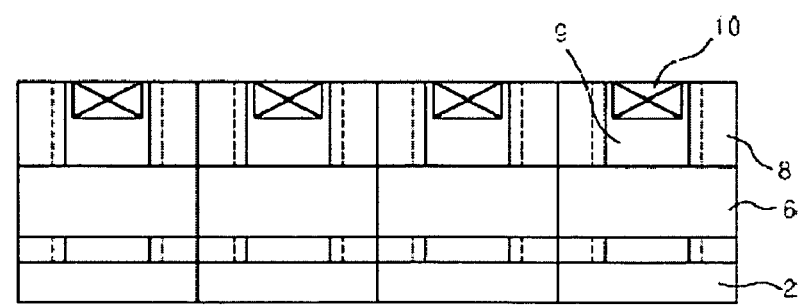
FIG. 2 illustrates, in a top view, a flash memory cell array manufactured without employing the SAS process.
Figure 3A:
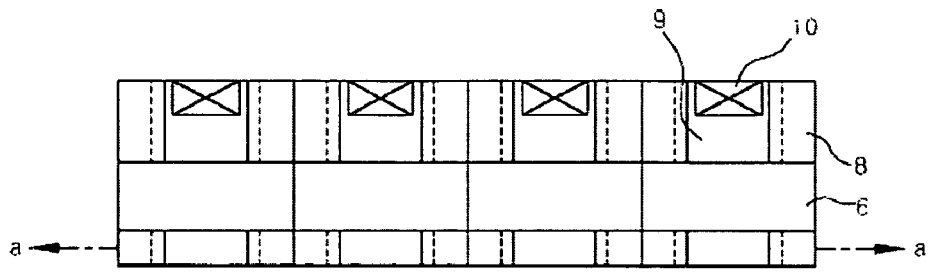
FIG. 3a illustrates, in a top view, a flash memory cell array manufactured by employing the SAS process.
Figure 3B:
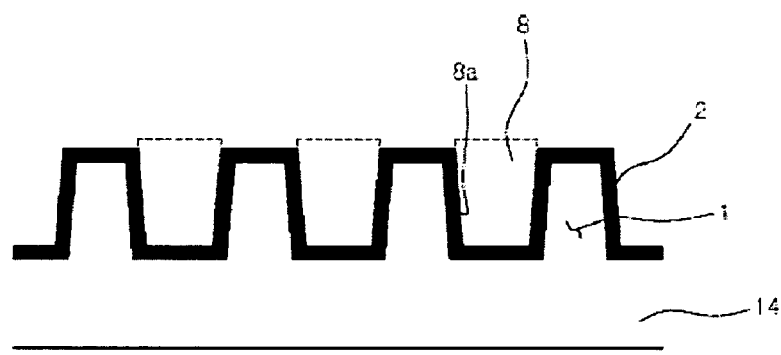
FIG. 3b is a cross-sectional view of FIG. 3a taken along the line a–a'.
Figure 4:
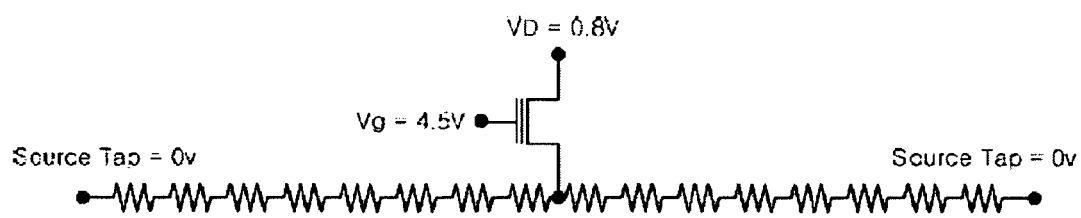
Figure 5:
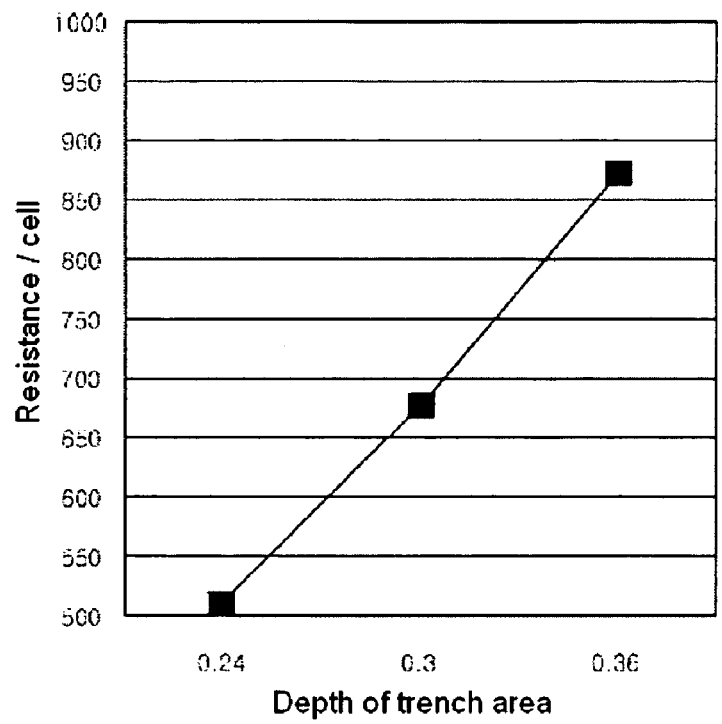
FIG. 5 is a graph illustrating a source resistance value according to the depth of a trench area.

As described in greater detail below, an example flash memory includes a cell region including a gate, a source line, a drain contact, and a cell trench area for device isolation on a silicon substrate. The example flash memory also includes a peripheral region positioned around the cell region and having a subsidiary circuit and a peripheral trench area for device isolation on the silicon substrate. The cell trench area of the cell region is shallower than the peripheral trench area of the peripheral region. The cell trench area is preferably between 1000 Å and 2000 Å in depth.

An example method of fabricating the example flash memory simultaneously employs STI and SAS processes to form a cell region for memory operation and a peripheral region including a subsidiary circuit for memory operation on a silicon substrate, amorphizing the surface of the cell region by implanting ions into the cell region and depositing a pad oxide layer and a pad nitride layer in sequence over the cell region and the peripheral region. In addition, the example fabrication method also forms a photoresist pattern over each of the pad nitride layer in the cell region and the peripheral region, removes some parts of the pad oxide layer and the pad nitride layer through an etching process using the photoresist pattern as a mask, wherein the etching process is stopped when the surface of the substrate in the cell region is exposed and, at the same time, the substrate in the peripheral region is etched by an appropriate depth, removes the photoresist pattern, and performs an etching process using the pad nitride layer etched as a mask so that a relatively shallow cell trench area is formed in the cell region and a relatively deep peripheral trench area is formed in the peripheral region.

The concentration of ion used in the ion implantation is preferably between 1E14 and 5E14. The ion implanted is preferably Ge or one selected from group IV elements. In addition, the ion implantation is performed using an inert gas such as Ar, Xe, or Kr.

Another example method of fabricating a flash memory by simultaneously employing STI and SAS processes forms a cell region for memory operation and a peripheral region including a subsidiary circuit for memory operation on a silicon substrate, implants ions into the cell region using As as a dopant for a channel, deposits a pad oxide layer and a pad nitride layer in sequence over the cell region and the peripheral region, forms a photoresist pattern over each of the pad nitride layer in both the cell and the peripheral regions, and removes some parts of the pad nitride layer, the pad oxide layer, and the substrate through an etching process using the photoresist pattern as a mask.

In the ion implantation step, the implanted As preferably has an energy value between 25 keV and 35 keV and the dosage of As is preferably about 1E13.

Yet another example method of fabricating a flash memory by employing STI and SAS processes forms a cell region for memory operation and a peripheral region including a subsidiary circuit for memory operation on a silicon substrate, amorphizes the surface of the cell region by implanting ions into the cell region, deposits a pad oxide layer and a pad nitride layer in sequence over the cell region as well as the peripheral region, forms a photoresist pattern on each of the pad nitride layer in both the cell and the peripheral regions, etches the pad nitride layer using an etching solution with a high selectivity of the pad nitride layer to the pad oxide layer, etches the pad oxide layer using an etching solution with a high selectivity of the pad oxide layer to the silicon substrate, and etches the silicon substrate using an etching solution with a high selectivity of the silicon substrate to the pad oxide layer.

Flash memory fabricated using the example methods described herein reduces source resistance, thereby improving the efficiency with which the flash memory may be read and programmed.

Figure 6:
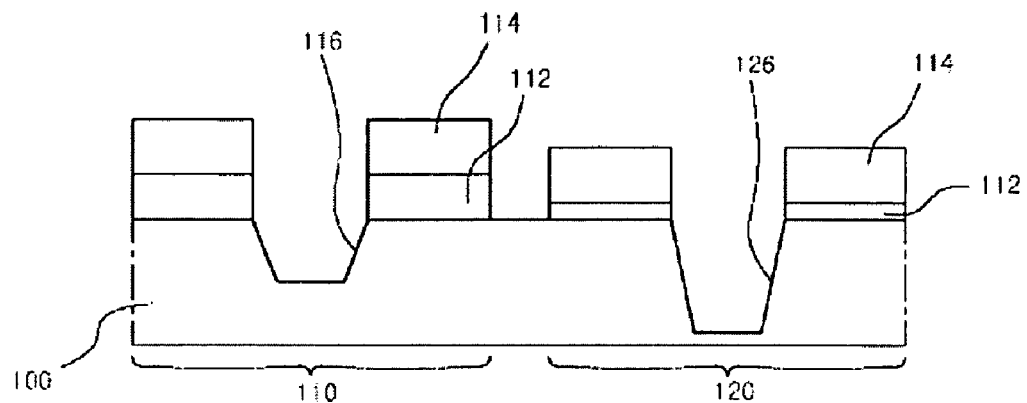
FIG. 6 illustrates, in a cross-sectional view, an example flash memory.

FIG. 6 illustrates, in a cross-sectional view, an example flash memory with a structure capable of reducing source resistance. The example flash memory includes a cell region 110 including a gate, a source line, a drain contact, and a cell trench area 116 for device isolation on a silicon substrate 100. The example flash memory also includes a peripheral region 120 positioned around the cell region 110 and a subsidiary circuit and a peripheral trench area 126 for device isolation on the silicon substrate 100. Here, the cell trench area 116 in the cell region 110 is shallower than the peripheral trench area 126 in the peripheral region 120. The depth of the cell trench area 116 is preferably between 1000 Å and 2000 Å and the depth of the peripheral trench area 126 is preferably between 3000 Å and 4000 Å. Accordingly, the resistance of a common source line formed along the cell trench area 116 can be reduced because the cell trench area 116 has a relatively shallow depth. Therefore, the efficiency of read and program of a flash memory fabricated according to the example flash memory can be improved.

Figure 7A:
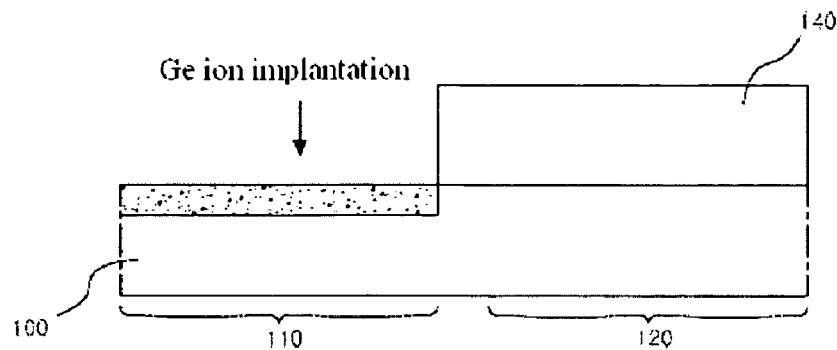
FIGS. 7a through 7d illustrate, in cross-sectional views, the process steps for fabricating the example flash memory of FIG. 6.

FIGS. 7a through 7d illustrate an example method for fabricating the example flash memory of FIG. 6. Referring to FIG. 7a, first, a cell region 110 for memory operation and a peripheral region 120 including a subsidiary circuit for memory operation are formed on a silicon substrate 100. A gate, a source line, and a drain contact (not shown) are formed on the cell region 110. Then, the surface of the cell region 110 is amorphized by implanting ions into the cell region 110 through a mask 140. The concentration of ion used in the ion implantation is preferably between 1E14 and 5E14. The implanted ion is preferably Ge or one selected from group IV elements. In addition, the ion implantation is performed, preferably, using an inert gas such as Ar, Xe, or Kr.

Figure 7B:
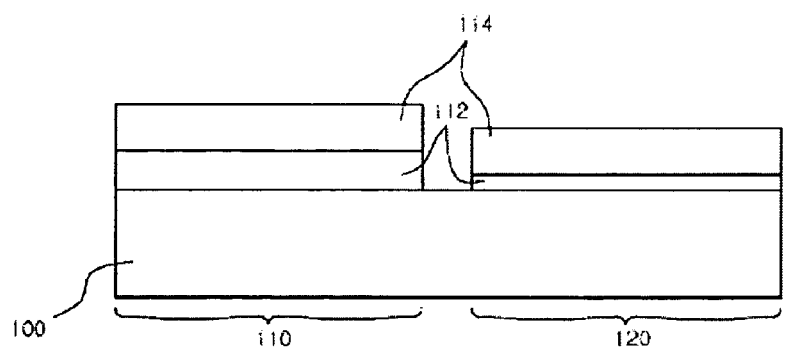

Referring to FIG. 7b, a pad oxide layer 112 and a pad nitride layer 114 are grown in sequence in both of the cell region 110 and the peripheral region 120. Each of the pad oxide layer 112 on the cell region 110 and the peripheral region 120 has different thickness because the growth rate of the pad oxide layer 112 on the amorphized cell region 110 is different from that on the peripheral region 120. In other words, the pad oxide layer 112 on the amorphized cell region 110 is thicker than the pad oxide layer 112 on the peripheral region 120 because the former grows more rapidly than the latter. However, the pad nitride layer 114 has the same thickness on both of the cell region 110 and the peripheral region 120.

Table 2 shows the thickness of a pad oxide layer that is grown according to various implantation conditions of Ge ions.

TABLE 2

| | Condition | | | | |
|---|---|---|---|---|---|
| | Ge Imp. 4E15@80 keV | Ge Imp. 2E15@80 keV | Ge Imp. 1E15@80 keV | Ge Imp. 5E15@80 keV | Ge Imp. 1E15@80 keV |
| Thickness | 1350 Å | 455 Å | 317.5 Å | 274.5 Å | 339 Å |

Figure 7C:
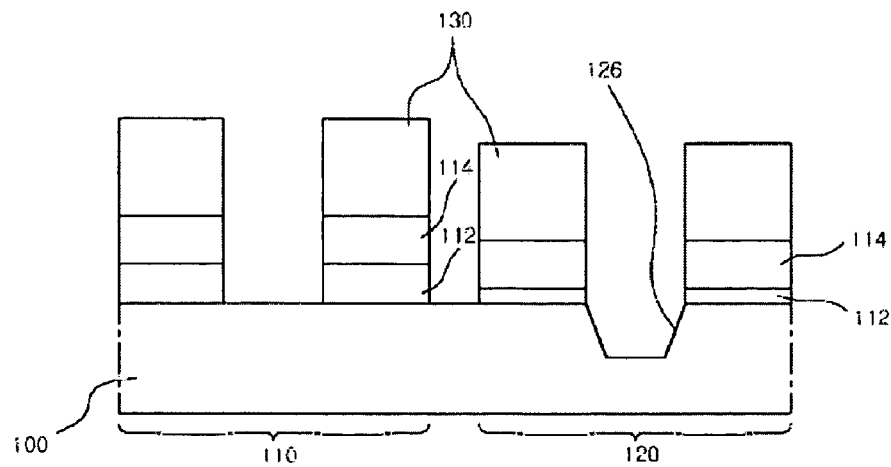

Referring to FIG. 7c, a photoresist pattern 130 is formed on each of the pad nitride layer 114 in the cell region 110 and the peripheral region 120. Then, some part of the pad nitride layer 114 and the pad oxide layer 112 is removed through an etching process using the photoresist pattern 130 as a mask. The etching process is stopped when the surface of the silicon substrate 100 in the cell region 110 is exposed and, at the same time, the substrate 100 in the peripheral region 120 is etched by an appropriate depth. A peripheral trench area 126 with an appropriate depth is formed into the peripheral region 120 when the surface of the substrate 100 in the cell region 110 begins to be exposed by the etching process because the pad oxide layer 112 on the peripheral region 120 is thinner than the pad oxide layer 112 on the cell region 110.

Figure 7D:
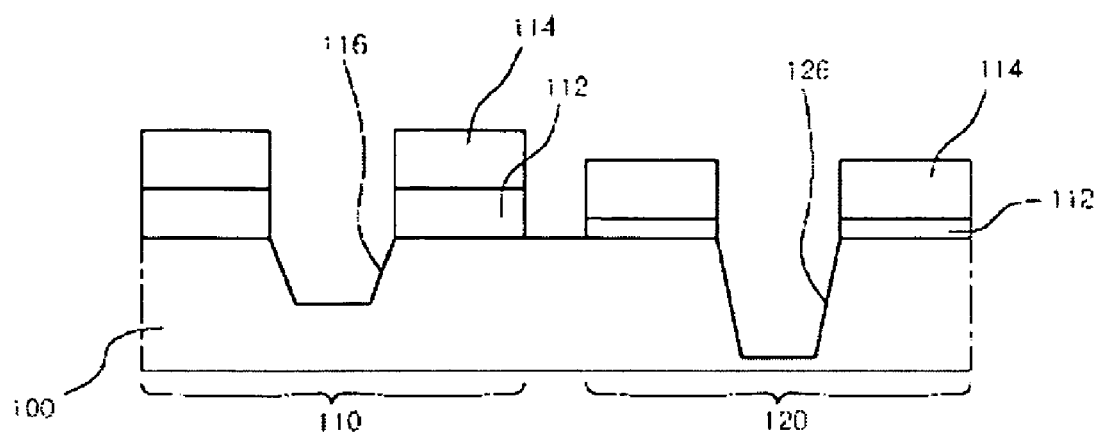

Referring to FIG. 7d, the photoresist pattern 130 is removed and the substrate 100 in the peripheral region is further etched using the pad nitride layer 114 as a hard mask. As a result, a flash memory is formed to have a shallow cell trench area 116 in the cell region 110 and a deep peripheral trench area 126 in the peripheral region 120.

Following the above example process, a common source line is formed into the cell trench area 116 by implanting ions in a following process, and then source resistance is reduced because the cell trench area 116 has a shallower depth than a convention cell trench area.

Another example method of fabricating a flash memory is described below. First, a cell region and a peripheral region including a subsidiary circuit for memory operation are formed on a substrate. Ions are implanted into the cell region. Here, arsenic (As) is used as a dopant for a channel. Then, a pad oxide layer and a pad nitride layer are deposited in sequence in the cell region and the peripheral region. A photoresist pattern is formed on each of the pad nitride layer in the cell region and the peripheral region. A portion of the pad nitride layer, the pad oxide layer, and the substrate is removed through an etching process using the photoresist pattern as a mask. In the ion implantation step, the energy value of implanted As is between 25 keV and 35 keV and the dosage of As is maintained at about 1E13.

Yet another example method of fabricating a flash memory is described below. First, a cell region and a peripheral region including a subsidiary circuit for memory operation are formed on a substrate. Ions are implanted into the cell region to amorphize the surface of the cell region. Then, a pad oxide layer and a pad nitride layer are deposited in sequence in the cell region and the peripheral region. A photoresist pattern is formed on each of the pad nitride layer in the cell region and the peripheral region. A photoresist pattern is spread over both the cell region and the peripheral region to function as a mask and the etching process of the pad nitride layer and the pad oxide layer follows, using an etching solution with a high selectivity. Then, the silicon substrate is etched by an etching solution with a high selectivity. As a result, the structure of a cell trench area shallower than a peripheral trench area in depth is formed in the substrate.

Although certain methods and apparatus have been described herein, the scope of coverage of this patent is not limited thereto. To the contrary, this patent covers all embodiments fairly falling within the scope of the appended claims either literally or under the doctrine of equivalents.

What is claimed is:

1. A method of fabricating a flash memory comprising:
    forming a cell region for memory operation and a peripheral region including a subsidiary circuit for memory operation on a silicon substrate;
    amorphizing the surface of the cell region by implanting ions into the cell region;
    depositing a pad oxide layer and a pad nitride layer in sequence over the cell region and the peripheral region;
    forming a photoresist pattern over each of the pad nitride layer in the cell region and the peripheral region;
    removing at least a portion of the pad oxide layer and the pad nitride layer through an etching process using the photoresist pattern as a mask, wherein the etching process is stopped when the surface of the substrate in the cell region is exposed and, at the same time, the substrate in the peripheral region is etched by an appropriate depth;
    removing the photoresist pattern; and
    performing an etching process using the pad nitride layer etched as a mask so that a relatively shallow cell trench area is formed in the cell region and a relatively deep peripheral trench area is formed in the peripheral region.

2. The method as defined by claim 1, wherein the ion concentration used to perform the ion implantation is between about 1E14 and 5E14.

3. The method as defined by claim 1, wherein the implanted ion is one of Ge and one selected from group IV elements.

4. The method as defined by claim 1, wherein the ion implantation is performed using an inert gas such as Ar, Xe, or Kr.

* * * * *